(12) United States Patent
Kanoh et al.

(10) Patent No.: US 7,268,621 B2
(45) Date of Patent: Sep. 11, 2007

(54) DIGITAL AMPLIFIER

(75) Inventors: Masaya Kanoh, Shizuoka-ken (JP); Masao Noro, Shizuoka-ken (JP)

(73) Assignee: Yamaha Corporation, Hamamatsu-shi (JP)

( * ) Notice: Subject to any disclaimer, the term of this patent is extended or adjusted under 35 U.S.C. 154(b) by 7 days.

(21) Appl. No.: 11/313,066

(22) Filed: Dec. 20, 2005

(65) Prior Publication Data

US 2006/0133002 A1    Jun. 22, 2006

(30) Foreign Application Priority Data

Dec. 21, 2004 (JP) .............................. 2004-369332

(51) Int. Cl.
*H03F 3/217* (2006.01)
(52) U.S. Cl. ...................... 330/251; 330/207 P; 330/10
(58) Field of Classification Search ................ 330/251, 330/207 P, 10
See application file for complete search history.

(56) References Cited

U.S. PATENT DOCUMENTS

| | | | | |
|---|---|---|---|---|
| 3,707,684 A | * | 12/1972 | Nowell | ............................ 330/9 |
| 5,892,404 A | * | 4/1999 | Tang | ............................ 330/297 |
| 6,939,347 B2 | * | 9/2005 | Thompson | ................... 606/34 |
| 7,076,070 B2 | * | 7/2006 | Pearce et al. | ............... 381/120 |
| 7,170,267 B1 | * | 1/2007 | McJimsey | ................... 323/271 |
| 2002/0167354 A1 | * | 11/2002 | Stanley | ......................... 330/10 |

FOREIGN PATENT DOCUMENTS

JP    2003060449    2/2003

OTHER PUBLICATIONS

Tamotsu Inaba, Basic and Practices of Power MOSFET Applications, CQ Publishing Co., Ltd., pp. pp. 68-72.

* cited by examiner

*Primary Examiner*—Patricia Nguyen
(74) *Attorney, Agent, or Firm*—Pillsbury Winthrop Shaw Pittman LLP (57) ABSTRACT

A threshold value adjustment circuit for adjusting a predetermined threshold value is provided in a stage followed by a protection circuit which starts protection operation when a load current flowing into an MOSFET exceeds the threshold value. A voltage proportional to a drain current and generated between the opposite ends of a current detection resistor Rd inserted between the high-side MOSFET and a positive power supply +V, and an output of an output voltage detection circuit for detecting the voltage amplitude of an analog signal from a low pass filter for modulating an output of a class D amplifier stage are inputted to the threshold value adjustment circuit. The threshold value adjustment circuit adjusts the threshold value in such a manner that a limit current of the MOSFET is set as the threshold value when the output voltage is large, and protection operation is started in response to a lower current than the limit current when the output voltage is small.

7 Claims, 7 Drawing Sheets

DIGITAL AMPLIFIER

BACKGROUND OF THE INVENTION

The present invention relates to a digital amplifier (class D amplifier), and particularly relates to an overcurrent detection circuit of the digital amplifier.

In recent years, digital amplifiers each provided for converting an analog signal such as a music signal into a pulse signal, amplifying the power of the pulse signal and outputting the amplified pulse signal through a low pass filter have been used broadly due to their high efficiency.

As a protection circuit in such a digital amplifier, there is known a current limiter (Non-Patent Document 1).

Figure 7:
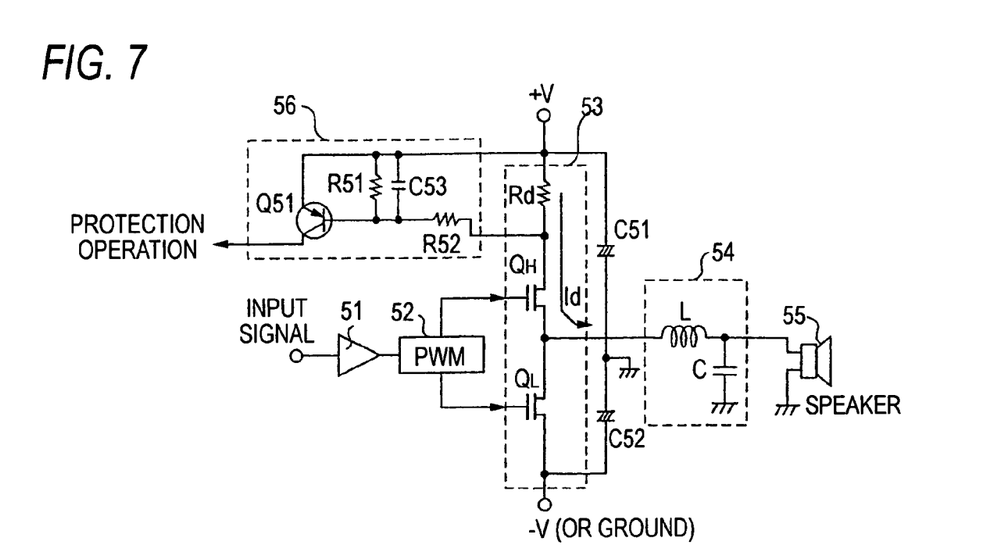
FIG. 7 is a diagram showing the configuration of a digital amplifier in the background art.

FIG. 7 is a view showing a configuration example of such a digital amplifier provided with a current limiter.

In FIG. 7, the reference numeral 51 designates an input amplifier; 52, a PWM modulation portion for generating a pulse signal in accordance with the amplitude of an input analog signal and outputting a driving signal for driving a class D amplifier stage; 53, the class D amplifier stage (switching stage) constituted by switching devices QH and QL which are power MOSFETs or the like; C51 and C52, decoupling capacitors; 54, an output filter (low pass filter) for reproducing an analog signal from a pulse signal outputted from the class D amplifier stage 53; 55, a speaker; and 56, a protection circuit for performing protection operation when the protection circuit detects the fact that a drain current Id flowing into the power MOSFET QH reaches a predetermined threshold value (limit value) or higher.

A current detection resistor Rd is inserted between a drain of the high-side MOSFET QH of the class D amplifier stage 53 and a positive power supply +V, so that a voltage Vd(=Rd·Id) is generated between the opposite ends of the current detection resistor Rd due to the drain current Id flowing into the MOSFET QH. Connection is made such that a voltage obtained by dividing the voltage Vd by resistors R51 and R52 is applied between a base and an emitter of a transistor Q51 of the protection circuit 56. As soon as an excessive drain current Id exceeding the limit value flows into the MOSFET QH due to a short-circuited load or the like, the transistor Q51 is electrically connected to perform protection operation for protecting the switching device QH.

Incidentally, although the current detection resistor Rd is inserted in the aforementioned description, there has been also a proposal in which protection operation is performed instead in accordance with a voltage generated between a drain and a source of an MOSFET and detected directly when the MOSFET is on (Patent Document 1).

Although an overcurrent flowing into the high-side switching device QH is detected in the example of FIG. 7, an overcurrent flowing into the low-side switching device QL may be detected instead or both the overcurrent flowing into the high-side switching device and the overcurrent flowing into the low-side switching device may be detected.

On the other hand, an analog power amplifier uses a PC limiter whose current threshold value of the current limiter has dependence on an output voltage.

Figure 8:
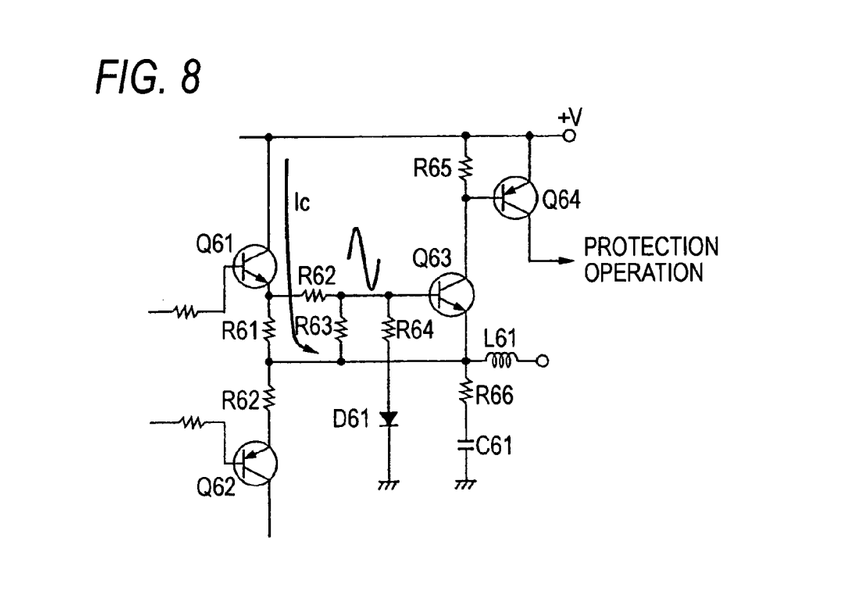
FIG. 8 is a diagram showing a configuration example of an analog power amplifier provided with a PC limiter.

FIG. 8 is a view showing a configuration example of such an analog power amplifier provided with a PC limiter.

In FIG. 8, resistors R62 and R63 are connected in parallel with an emitter resistor R61 of an output transistor Q61. This connection point between the emitter resistor R61 and the resistors R62 and R63 is connected to a base of a transistor Q63. The base of the transistor Q63 is connected to the ground through a resistor R64 and a diode D61.

In the circuit configured thus, a voltage is generated between the opposite ends of the resistor R61 in accordance with a load current Ic of the output transistor Q61. A partial voltage obtained by dividing this voltage by the resistors R62 and R63 and a partial voltage obtained by dividing the output voltage by the resistors R63 and R64 (voltage reverse to the partial voltage obtained by the resistors R62 and R63) are generated between the opposite ends of the resistor R63. When a voltage obtained thus between the opposite ends of the resistor R63 is higher than a voltage with which the transistor Q63 can be electrically connected, the transistor Q63 is electrically connected so that a transistor Q64 is electrically connected. Thus, protection operation is started.

In this manner, the load current Ic of the output transistor Q61 is detected from the voltage generated between the opposite ends of the emitter resistor R61 of a power amplifier output stage and the amplitude of the output voltage is acquired by the resistor R63. Thus, protection operation is performed in response to a large current value when the amplitude of the output voltage is large. On the other hand, protection operation is performed in response to a small current value when the amplitude of the output voltage is small.

According to the PC limiter, for example, when the load is short-circuited, the current limit value can be set to be so small that a load imposed on an output device can be reduced. Consequently, the PC limiter is more effective than the aforementioned current limiter in terms of protection of the output device.

Patent Document 1: Japanese Patent Laid-Open No. 2003-060449

Non-Patent Document 1; Tamotsu Inaba, "Basics and Practices of Power MOSFET Applications", CQ Publishing Co. Ltd., Nov. 1, 2004, pp. 68-72

In order to design a digital amplifier to take a large maximum output, a threshold value of a current to be detected by a current limiter has to be set in accordance with a maximum load current of an MOSFET in an output stage. As a result, the MOSFET in the output stage may be broken because protection operation is not carried out, for example, when a speaker is damaged in a short mode during reproduction with a small signal, when the speaker with a low AC impedance beyond the real capability of the amplifier is sounded with large amplitude, or when the speaker is used for a long term with a part of speaker wires being left in contact with a negative terminal, a chassis, etc. due to customer's faulty wiring. It is general that a customer may arrange faulty wiring or there may be a frequency band in which the AC impedance of the speaker is lower than a nominal value. In such a case, it is necessary to protect the set from damage.

In the digital amplifier, the waveform of a power supply voltage switched on and off repeatedly appears simply short of a coil of an output filter. Any output amplitude of a sine wave etc. is expressed by the duty ratio of the switching. Accordingly, there is a problem that the aforementioned PC limiter serving in the analog amplifier cannot detect the output amplitude of a final signal.

Further, the background-art current limiter in the aforementioned digital amplifier performs protection operation simply by switching on and off an output transistor. It is therefore impossible to perform an operation to monitor a load current in any time so as to limit the maximum output amplitude in consideration of the balance between the load current and the real capability of the amplifier.

SUMMARY OF THE INVENTION

An object of the invention is therefore to provide a digital amplifier which can perform optimized protection operation.

In order to attain the foregoing object, the invention provides a digital amplifier having: a class D amplifier stage including a first switching device and a second switching device connected in series; a low pass filter connected to output of the class D amplifier stage; a current detection unit for detecting a pulse current flowing into at least the first switching device or the second switching device; an output voltage detection unit for detecting a voltage of an analog signal outputted from the low pass filter; and a protection unit for performing protection operation on the basis of the current value detected by the current detection unit and the output voltage detected by the output voltage detection unit, the protection unit starting protection operation in response to a low current value when the output voltage is low, the protection unit starting protection operation in response to a high current value when the output voltage is high.

The current detection unit is designed to detect a voltage generated between the opposite ends of a resistor inserted in series with the first or second switching device, or to detect a voltage generated between the opposite ends of the first or second switching device when the switching device is on.

Further, the protection unit is designed to include a switching element that is activated when the current value detected by the current detection unit exceeds a predetermined threshold value, and a threshold value adjustment circuit changing the threshold value in accordance with the output voltage detected by the output voltage detection unit. Or the protection unit is designed so that the current value detected by the current detection unit and the output voltage detected by the output voltage detection unit are inputted in the protection unit, and the protection unit performs protection operation when the current value exceeds a threshold value corresponding to the output voltage.

The digital amplifier further includes a switching element for disconnecting the output low pass filter and a load from each other in accordance with an output of the protection unit, or a unit for controlling the amplitude of an input signal in accordance with an output of the protection unit.

According to the digital amplifier of the invention, a PC limiter similar to that in the analog amplifier in the background art can be arranged. A speaker may be damaged in a short mode during reproduction with a small signal. A speaker with a low AC impedance beyond the real capability of the amplifier may be sounded with large amplitude. A speaker may be used for a long term with a part of speaker wires being left in contact with a negative terminal, a chassis, etc. due to customer's faulty wiring. In such a case, protection operation can be performed in response to a low current value. On the other hand, at the time of output with the maximum amplitude in a defined load, detection of abnormality can be suspended till the current of an output device reaches its rated current. It is therefore possible to obtain a safe and high-power amplifier.

Further, according to the digital amplifier according to the invention in which the current value detected by the current detection unit and the output voltage detected by the output voltage detection unit are inputted so that protection operation is performed when the current value exceeds a threshold value corresponding to the output voltage, it is possible to perform optimized protection operation in consideration of the balance between the load current and the real capability of the amplifier.

Moreover, according to the digital amplifier according to the invention in which the amplitude of an input signal is controlled by the output of the protection unit, it is possible to automatically reduce a signal level to an amplitude level with which the output MOSFET can be driven in an amplitude range safe enough not to damage the output MOSFET, or it is possible to suppress only the maximum output amplitude. Particularly when a speaker with a low AC impedance beyond the real capability of the amplifier is sounded with large amplitude, reproduction can be performed continuously without shutting off the amplifier.

DETAILED DESCRIPTION OF PREFERRED EMBODIMENTS

Figure 1:
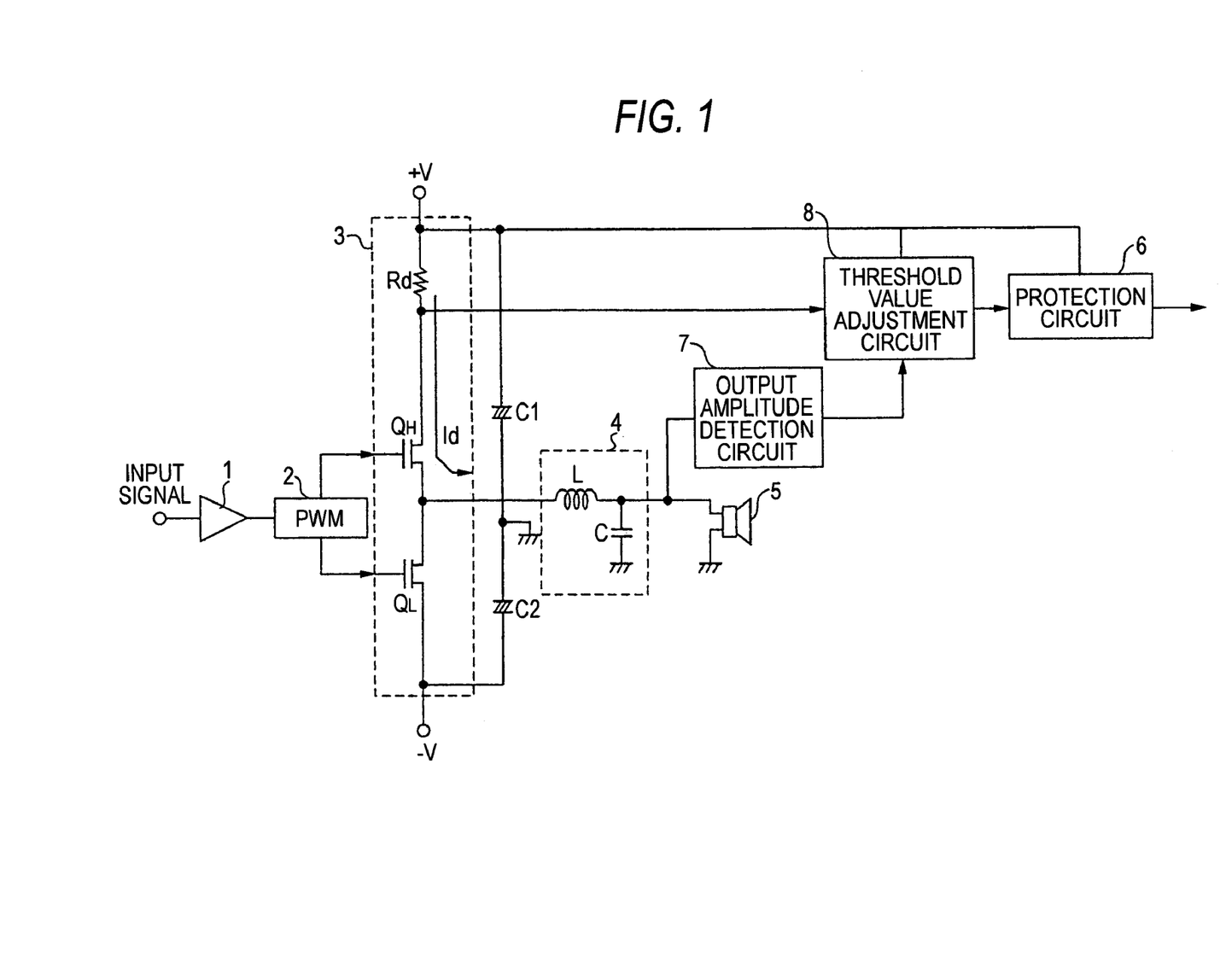
FIG. 1 is a block diagram showing the schematic configuration of an embodiment of a digital amplifier according to the invention.

FIG. 1 is a block diagram showing the schematic configuration of a digital amplifier according to an embodiment of the invention. In FIG. 1, the reference numeral 1 designates an input amplifier for amplifying an analog input signal; 2, a PWM (Pulse Width Modulation) modulation portion for generating a PWM signal with a pulse width corresponding to the amplitude of the analog signal from the input amplifier 1 and outputting a driving signal for driving switching devices QH and QL of a class D amplifier stage 3; 3, the class D amplifier stage (switching stage) having the switching devices QH and QL, which are MOSFETs or the like, connected in series; C1 and C2, decoupling capacitors; 4, an output filter (low pass filter) for reproducing an analog signal from a pulse signal outputted from the class D amplifier stage 3; and 5, a speaker serving as a load.

As shown in FIG. 1, a current detection resistor Rd is inserted between the high-side switching device QH and a positive power supply +V so that a voltage Vd expressed by $Id \cdot Rd (=Vd)$ when a drain current Id flowing in the switching device QH is generated between the opposite ends of the current detection resistor Rd. Incidentally, the resistance value of the resistor Rd is set at a low value (e.g. about several tens of ohms) in order to reduce loss.

In addition, the reference numeral 6 designates a protection circuit similar to the protection circuit 56 in FIG. 7, That is, the protection circuit 6 performs protection operation to prevent the switching device QH from being damaged when the load current (drain current) Id flowing into the switching device QH exceeds a predetermined threshold value. An output voltage detection circuit 7 is connected to the output side (connection point to the speaker 5) of the low pass filter 4 so as to detect the voltage amplitude of an analog output signal. A current threshold value adjustment circuit 8 receives the voltage Vd generated between the opposite ends of the current detection resistor Rd and the output of the output voltage detection circuit 7. In accordance with the amplitude of the analog output signal, the current threshold value adjustment circuit 8 adjusts a current threshold value (limit value) with which the protection circuit 6 will start protection operation. The current threshold value adjustment circuit 8 serves to control the protection operation to start in response to a large current value when the voltage amplitude of the analog output signal is large, and to start in response to a small current value when the voltage amplitude is small. In this manner, protection can be performed in accordance with the loss of the switching device QH so that safe protection operation can be achieved without loss of the maximum output. Incidentally, specific configurations of the output voltage detection circuit 7 and the threshold value adjustment circuit 8 will be described later.

Figure 2:
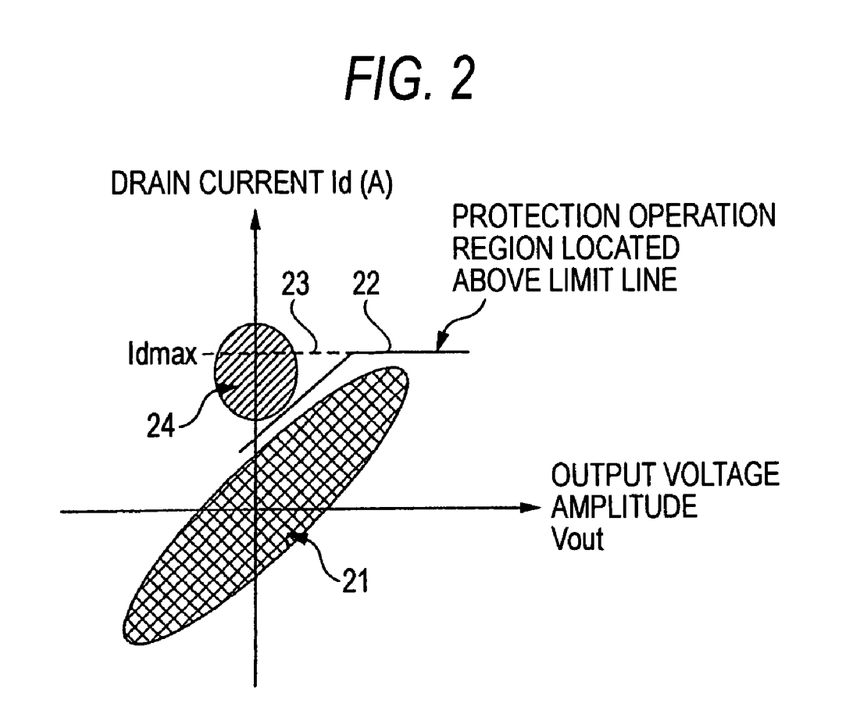
FIG. 2 is a graph for explaining a region where protection operation is preformed in the digital amplifier according to the invention.

FIG. 2 is a graph showing a region where protection operation is executed in the digital amplifier configured thus according to the invention.

In FIG. 2, the abscissa designates output voltage amplitude (Vout) of an analog output signal, and the ordinate designates a load current (drain current) Id flowing into the switching device. In FIG. 2, the reference numeral 21 designates a signal reproduction region in normal use; and 22, a current threshold value (limit line) for performing protection operation. A region where the drain current Id is higher than the limit line 22 is a protection operation execution region. As shown in FIG. 2, the limit line 22 takes a maximum value Idmax (limit current) of the drain current when the output voltage amplitude Vout is large. As the output voltage amplitude Vout decreases, the limit line also decreases. Thus, protection operation can be performed in an abnormal region 24 with a small amplitude and a large current as shown in FIG. 2, for example, at the time of a short circuit of the speaker or at the time of an overload.

On the other hand, as indicated by the broken line 23 in FIG. 2, a limit line in a current limiter in the background art is fixed to a constant value (Idmax) regardless of the output voltage amplitude. Thus, protection operation cannot be performed in the abnormal region 24 with a small amplitude and a large current as shown in FIG. 2.

In this manner, according to the invention, safe protection can be performed even in a low current region in the digital amplifier, in the same manner as the PC limiter of the background-art analog amplifier.

Although description has been made on the case where the current detection resistor Rd is inserted between the switching device QH and the positive power supply +V in order to detect a load current, the load current may be detected by detecting a voltage generated between the opposite ends of the switching device when the switching device is on.

In the embodiment shown in FIG. 1, it is intended to detect only the current flowing into the high-side switching device QH. However, it may be intended to detect the current flowing into the low-side switching device QL. Alternatively, a current detection resistor, an output voltage detection circuit and a current threshold value adjustment circuit may be provided for each of the high side and the low side so as to start protection operation in accordance with high-side and low-side current detection outputs.

Further, protection operation may not be performed by disconnecting the circuit to the speaker or by cutting off the power supply so as to shut down the digital amplifier but may be performed by controlling the level of the input signal or limiting the amplitude thereof so as to reduce the load current while continuing operation within a range of the real capability of the digital amplifier.

Various embodiments of such digital amplifiers according to the invention will be described below.

Figure 3:
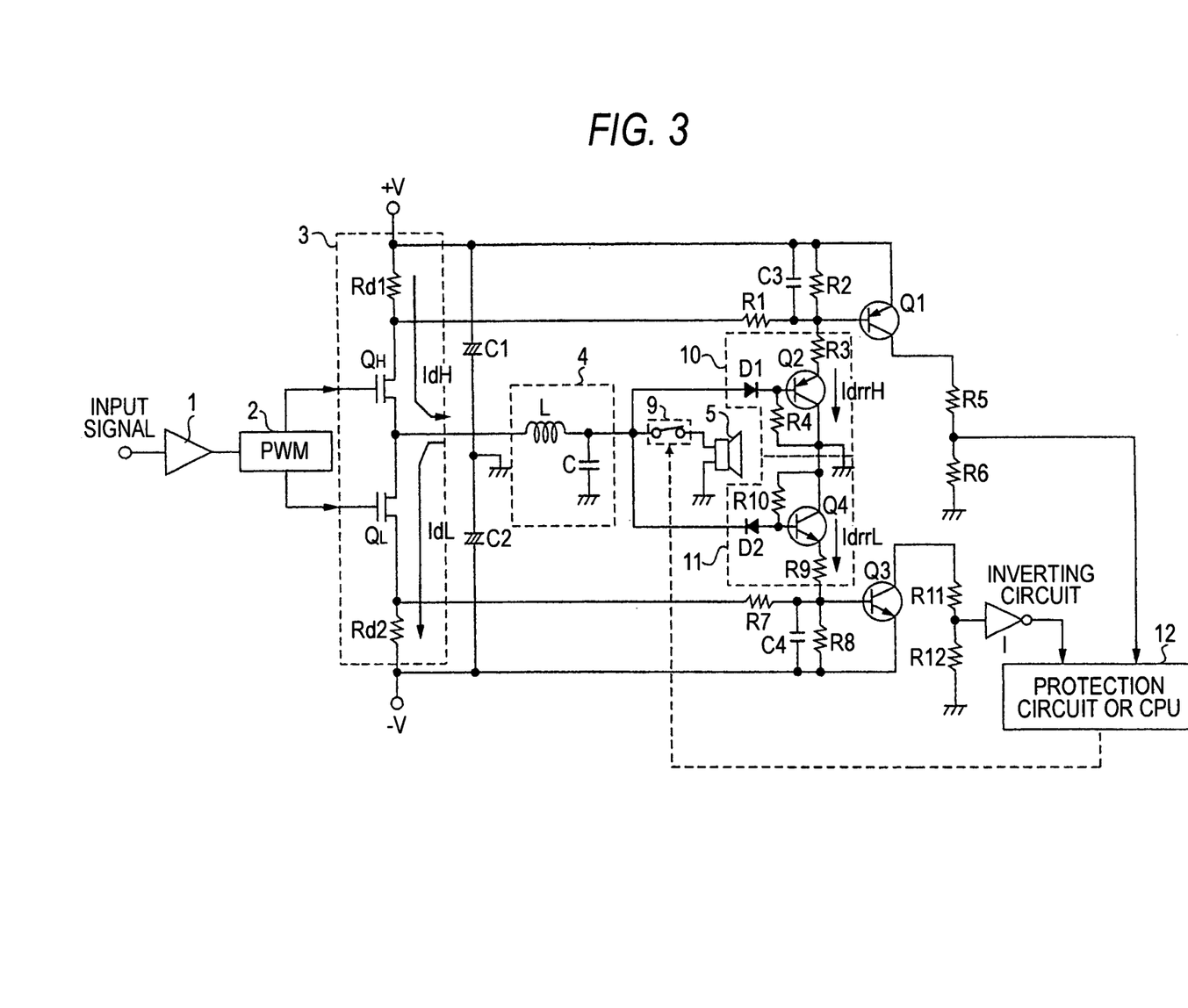
FIG. 3 is a block diagram showing the configuration of another embodiment of a digital amplifier according to the invention.

FIG. 3 is a block diagram showing the configuration of an embodiment of a digital amplifier according to the invention. In FIG. 3, an input amplifier 1, a PWM modulation portion 2, a class D amplifier stage 3, an output low pass filter 4 and a speaker 5 are similar to those shown in FIG. 1.

In this embodiment, currents are detected in both the high side and the low side. A first current detection resistor Rd1 is inserted between a high-side switching device (MOSFET) QH and a positive power supply +V, and a second current detection resistor Rd2 is inserted between a low-side switching device (MOSFET) QL and a negative power supply −V. In addition, a switch 9 is inserted between the low pass filter 4 and the speaker 5 so as to disconnect the low pass filter 4 and the speaker 5 from each other in accordance with an output of a protection circuit (or CPU) 12. A high-side output voltage detection circuit 10 and a low-side output voltage detection circuit 11 are connected to the output side of the low pass filter 4.

In the digital amplifier configured thus, a voltage generated between the opposite ends of the high-side current detection resistor Rd1 is divided by resistors R1 and R2 to be thereby supplied to a base of a PNP type transistor Q1. To the base of the transistor Q1, the high-side output voltage detection circuit 10 is connected and an emitter of a PNP type transistor Q2 is connected through a resistor R3. A collector of the transistor Q2 is connected to the ground while a cathode of a diode D1 is connected to a base of the transistor Q2. A resistor R4 is connected between the base of the transistor Q2 and the ground. An anode of the diode D1 is connected to the output side of the low pass filter 4.

A current IdrrH (sinking current) is designed to always flow into the transistor Q2 of the output voltage detection circuit 10 configured thus. When the amplitude of an output voltage outputted from the low pass filter 4 is large, the base potential of the transistor Q2 increases through the diode D1 so that the value of the sinking current IdrrH becomes small. On the contrary, when the amplitude of the output voltage is small, the value of the sinking current IdrrH becomes large.

A voltage VdH(=IdH·Rd1) is generated between the opposite ends of the current detection resistor Rd1 due to a drain current IdH flowing into the MOSFET QH. A voltage obtained by dividing the voltage VdH by the resistors R1 and R2, and a voltage generated between the opposite ends of the resistor R2 due to the sinking current IdrrH flowing into the transistor Q2 are applied between the base and an emitter of the transistor Q1. Here, assume that the resistance values of the resistors R1, R2 and R3 are adjusted so that the base-emitter voltage of the transistor Q1 is equal to a voltage (about 0.6 V) with which the transistor Q1 can be electrically connected when the amplitude of the output voltage is large while the value of the sinking current IdrrH is small, and the drain current flowing into the MOSFET QH is equal to the limit current Idmax. Thus, when the amplitude of the output voltage is large, the transistor Q1 is electrically connected as soon as IdH reaches Idmax. On the contrary, when the amplitude of the output voltage is small, the voltage drop between the opposite ends of the resistor R2 increases due to increase of the sinking current IdrrH flowing into the transistor Q2. As a result, the transistor Q1 is electrically connected in spite of the low voltage generated between the opposite ends of the current detection resistor Rd1. Accordingly, when the amplitude of the output voltage is small, the current threshold value with which the transistor Q1 can be electrically connected can be reduced so that protection against the abnormal region with a small amplitude and a large current shown as shown in FIG. 2 can be achieved.

Incidentally, when the transistor Q1 is electrically connected, a positive voltage is inputted to the protection circuit 12 by resistors R5 and R6. In response to the positive voltage, the protection circuit 12 cuts off the switch 9 so as to disconnect the load (speaker 5) to thereby protect the MOSFETs QH and QL. The power supply may be cut off instead.

The low side is arranged in the same manner as the high side. That is, a current detection resistor Rd2 is inserted between a drain of the low-side MOSFET QL and a negative power supply −V and connected to a base of an NPN type transistor Q3 through a voltage divider circuit constituted by resistors R7 and R8. An emitter of an NPN type transistor Q4 is connected to the base of the transistor Q3 through a resistor R9. A collector of the transistor Q4 is connected to the ground. A base of the transistor Q4 is connected to the ground through a resistor R10 and connected to an anode of a diode D2. A cathode of the diode D2 is connected to the output side of the low pass filter 4.

In the same manner as in the aforementioned high-side transistor Q2, a sinking current IddrL flows into the transistor Q4 in any time. A value of the sinking current IdrrL is small when the negative-side voltage amplitude of an analog signal outputted from the low pass filter 4 is large. The value of the sinking current IdrrL is large when the negative-side voltage amplitude of the analog signal outputted from the low pass filter 4 is small. In the same manner as described above, the values of the resistors R7, R8 and R9 are set so that the transistor Q3 is electrically connected when the sinking current IdrrL is small and a drain current IdL flowing into the low-side MOSFET QL reaches the limit current Idmax of the MOSFET QL. Thus, when the negative-side amplitude of the output voltage is large, the transistor Q3 is electrically connected as soon as the drain current IdL flowing into the MOSFET QL reaches the limit current Idmax. When the amplitude of the output voltage is small, the sinking current IdrrL flowing into the transistor Q4 becomes large. Therefore, the voltage generated in the resistor R8 increases so that the transistor Q3 is electrically connected in response to a lower current than the limit current Idmax. Thus, protection against the abnormal region with a small amplitude and a large current as shown in FIG. 2 can be achieved.

Incidentally, the polarity of a negative voltage generated in a resistor R12 due to the electric connection of the transistor Q3 is inverted to be positive by an inverting circuit I. The polarity-inverted voltage is inputted to the protection circuit 12. The protection circuit 12 executes protection operation such as disconnection of the switch 9 when either an input indicating that the transistor Q1 has been electrically connected or an input indicating that the transistor Q3 has been electrically connected is generated.

In this manner, in this embodiment, a current monitoring means is provided on both the high side and the low side so that protection operation similar to that of the PC limiter of the analog amplifier can be achieved by the digital amplifier.

Figure 4:
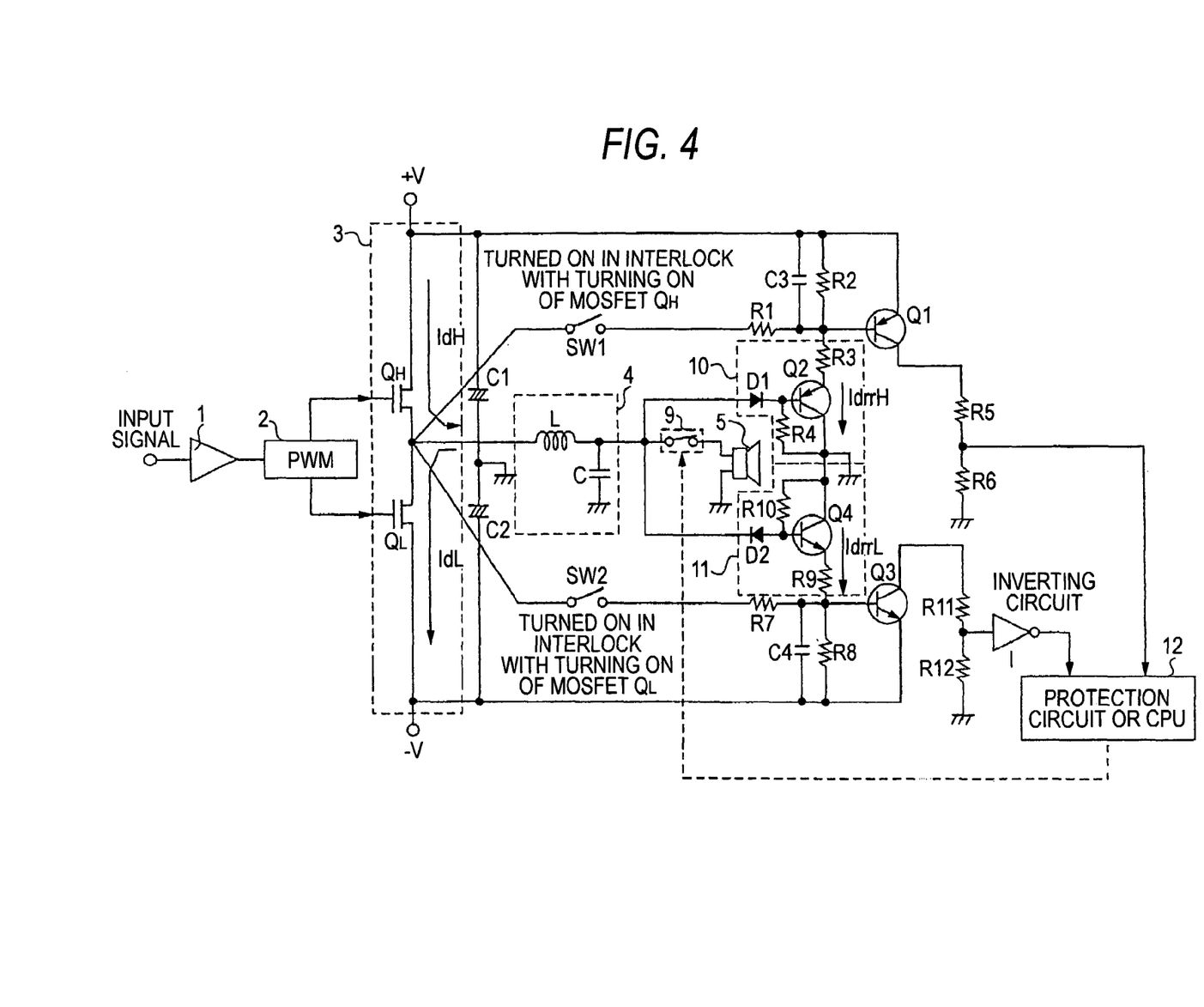
FIG. 4 is a block diagram showing the configuration of further another embodiment of a digital amplifier according to the invention.

FIG. 4 is a view showing the configuration of another embodiment of the invention.

In this embodiment, current detection resistors Rd1 and Rd2 are not inserted as in the aforementioned embodiment shown in FIG. 3. Voltages are generated between the opposite ends of a high-side MOSFET QH and between the opposite ends of a low-side MOSFET QL due to their on-resistances respectively when the high-side MOSFET QH and the low-side MOSFET QL are on. Those voltages are detected to detect currents flowing into the high-side MOSFETs respectively. In FIG. 4, constituent parts the same as those in FIG. 3 are denoted by the same reference numerals correspondingly and description thereof will be omitted here.

In FIG. 4, a switch SW1 is a switch controlled by a driving signal of the MOSFET QH so to be turned on/off in interlock with the MOSFET QH, and a switch SW2 is a switch controlled by a driving signal of the MOSFET QL so as to be turned on/off in interlock with the MOSFET QL.

When the high-side MOSFET QH is turned on, the switch SW1 is turned on in interlock with the MOSFET QH, with the result that a voltage generated between the opposite ends of the MOSFET QH due to the on-resistance (about several or several tens of ohms) of the MOSFET QH is supplied to a series circuit of resistors R1 and R2 through the switch SW1. Accordingly, in the same manner as in the case of FIG. 3, a drain current IdH flowing into the MOSFET QH can be detected.

Further, when the low-side MOSFET QL is turned on, the switch SW2 is turned on in interlock with the MOSFET QL, with the result that a voltage generated between the opposite ends of the MOSFET QL is supplied to a series circuit of resistors R7 and R8 through the switch SW2. Accordingly, in the same manner as described above, a drain current IdL flowing into the MOSFET QL can be detected.

According to this embodiment, it is possible to prevent loss caused by insertion of the current detection resistors Rd1 and Rd2.

In the aforementioned embodiments, the drain currents on both the high side and the low side are detected for protection operation. The invention is not limited to the embodiments. Only the current on the high side or only the current on the low side may be detected for protection operation.

Processing by the protection circuit 12 is not limited to shutdown based on disconnection of the switch 9 or power off. By controlling the level of the input signal or limiting the amplitude of the input signal, the load current may be suppressed to continue operation within a range of the capability of the MOSFET.

Figure 5:
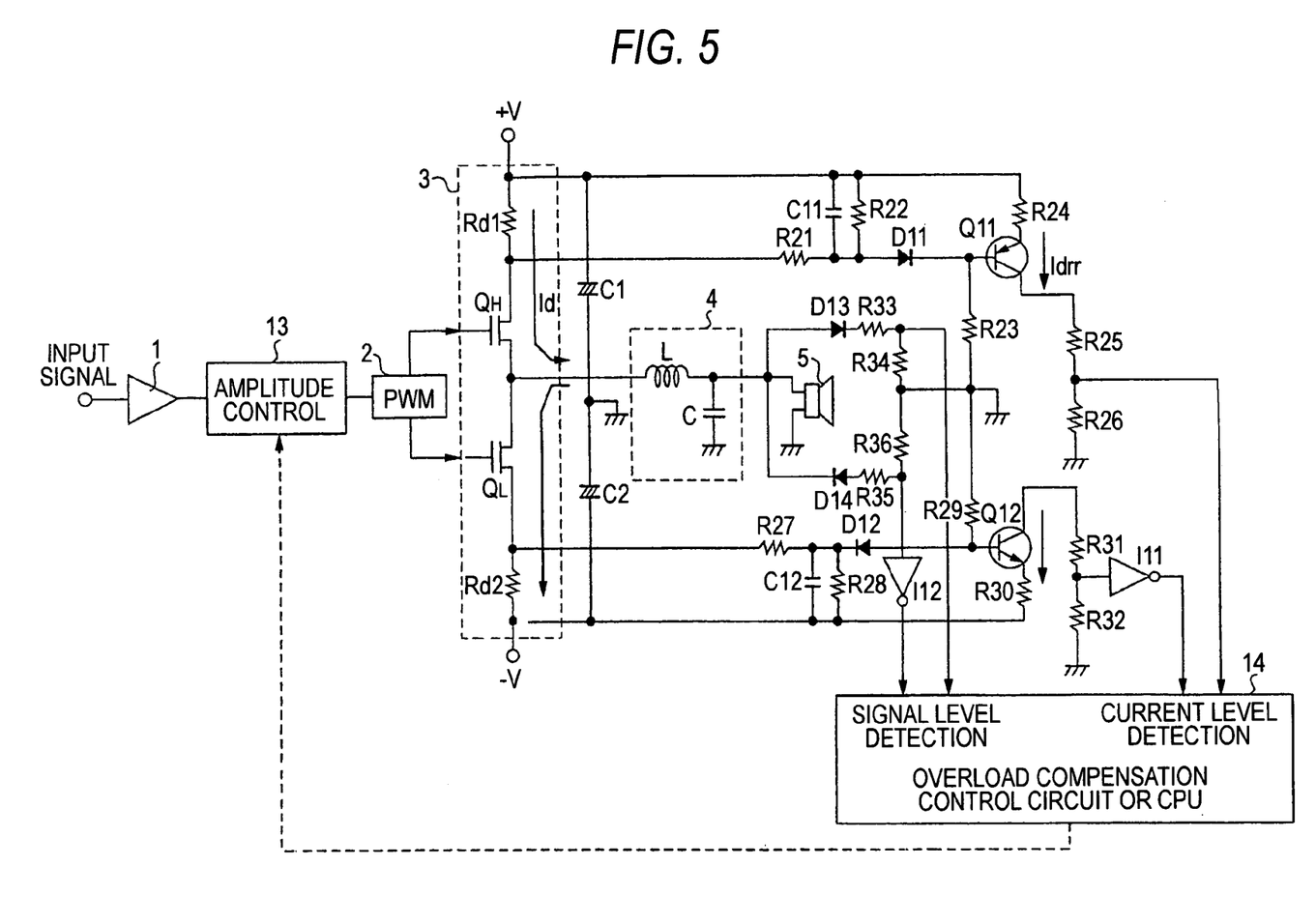
FIG. 5 is a block diagram showing the configuration of further another embodiment of a digital amplifier according to the invention.

FIG. 5 is a view showing the configuration of further another embodiment of a digital amplifier according to the invention.

In the embodiment shown in FIG. 5, a pulse current flowing into each switching device such as an MOSFET etc. and a voltage amplitude of an analog output signal from a low pass filter are always monitored so as to determine the correspondence between a load current and an output voltage. Based on the determined correspondence, protection operation is performed. In this embodiment, the amplifier is not shut down, but overload compensation control is performed as the protection operation. In the overload compensation control, the amplitude of an input signal is controlled to suppress the load current so as to continue operation.

In FIG. 5, constituent parts the same as those in FIG. 3 are denoted by the same reference numerals correspondingly and description thereof will be omitted here.

In this embodiment, an amplitude control portion 13 for controlling the amplitude of an input signal is provided between the aforementioned input amplifier 1 and the aforementioned PWM modulation portion 2. A voltage limiter circuit for limiting the amplitude of the input signal, an attenuator for adjusting the level of the input signal, or the like can be used as the amplitude control portion 13.

In the same manner as in the case of FIG. 3, a current detection resistor Rd1 is inserted between a high-side MOSFET QH and a positive power supply +V. A resistor R21 and a parallel circuit constituted by a resistor R22 and a capacitor C11 are connected in series between the opposite ends of the current detection resistor Rd1. A connection point between the resistors R21 and R22 is connected to an anode of a diode D11. A cathode of the diode D11 is connected to a base of a PNP type transistor Q11. The base of the transistor Q11 is connected to the ground through a resistor R23. An emitter of the transistor Q11 is connected to the positive power supply +V through a resistor R24. A collector of the transistor Q11 is connected to the ground through a series circuit constituted by resistors R25 and R26. A connection point between the resistors R25 and R26 serves as an input to an overload compensation control circuit (or CPU) 14.

A voltage Vd(=IdH·Rd1) is generated between the opposite ends of the current detection resistor Rd1 due to a drain current IdH flowing into the high-side MOSFET QH. A voltage obtained by dividing the voltage Vd by the resistors R21 and 322 is applied to the base of the transistor Q11 through the diode D11. A current IdpH proportional to the voltage applied to the base of the transistor Q11 flows into the transistor Q11. That is, a current proportional to the drain current IdH of the high-side MOSFT QH flows into the transistor Q11 so that a voltage whose magnitude is proportional to the drain current IdH is generated between the opposite ends of the resistor R26. This voltage (high-side current level detection signal) is inputted to the overload compensation control circuit 14 so that the drain current IdH can be monitored by the overload compensation control circuit 14 in any time.

An anode of a diode D13 is connected to the output side of the low pass filter 4. A cathode of the diode D13 is connected to the ground through a series circuit constituted by resistors R33 and R34. A connection point between the resistors R33 and R34 serves as an input to the overload compensation control circuit 14.

Thus, a signal (high-side signal level detection signal) proportional to the positive-side voltage amplitude of an analog signal outputted from the low pass filter is inputted to the overload compensation control circuit 14 so that the output signal voltage can be always monitored by the overload compensation control circuit 14.

The low side is arranged in the same manner as the high side. A current detection resistor Rd2 is inserted between a drain of the low-side MOSFET QL and a negative power supply −V. A resistor R27 and a parallel circuit constituted by a resistor R28 and a capacitor C12 are connected in series between the opposite ends of the current detection resistor Rd2. A cathode of a diode D12 is connected to a connection point between the resistor R27 and the resistor R28. An anode of the diode D12 is connected to a base of an NPN type transistor Q12 and connected to the ground through a resistor R29. An emitter of the transistor Q12 is connected to the negative power supply −V through a resistor R30. A collector of the transistor Q12 is connected to the ground through a series circuit constituted by resistors R31 and R32. A connection point between the resistors R31 and R32 serves as a low-side current level detection signal to be inputted to the overload compensation control circuit 14 through an inverting circuit I11 for polarity inversion.

Further, a cathode of a diode D14 is connected to the output side of the low pass filter 4. An anode of the diode D14 is connected to the ground through a series circuit constituted by resistors R35 and R36. A connection point between the resistors R35 and R36 serves as a low-side signal level detection signal to be inputted to the overload compensation control circuit 14 through an inverting circuit I12 for polarity inversion.

In this manner, the high-side current detection signal whose magnitude is proportional to the drain current IdH of the high-side MOSFET QH inputted from the connection point between the resistors R25 and R26, the signal level detection signal proportional to the positive-side voltage of the output signal inputted from the connection point between the resistors R33 and R34, the low-side current level signal whose magnitude is proportional to the drain current IdL of the low-side MOSFET QL inputted from the inverting circuit I11, and the signal level detection signal proportional to the negative-side voltage of the output signal inputted from the inverting circuit I12 are always inputted to the overload compensation control circuit 14. Thus, the currents flowing into the MOSFETs QH and QL and the output signal level can be observed in real time. For example, when the overload compensation control circuit 14 is constituted by a microcomputer, the overload compensation control circuit 14 can A/D convert each input signal so as to acquire the current value of the signal and the output voltage value.

The overload compensation control circuit 14 determines whether the load current flowing into the MOSFET balances with the level of the output signal or not. When the overload compensation control circuit 14 concludes that a current near the limit of the MOSFET QH flows, the overload compensation control circuit 14 outputs a control signal to the amplitude control portion 13 to limit the maximum voltage of the input signal or reduce the level of the input signal. Thus, the load current flowing into the MOSFET QH, QL can be reduced so that the switching device can be protected and reproduction can be continued correspondingly to the really working load and the real capability of the amplifier.

For example, a table in which limit current values for MOSFETs in the amplitude of the output voltage have been recorded in accordance with various values of the amplitude of the output voltage may be stored in the overload compensation control circuit 14 in advance. Based on the current level detection signal and the signal level detection signal observed in real time, the overload compensation control circuit 14 determines whether a difference between the current level detection signal at that time and a corresponding limit current value is larger than a predetermined value or not. When the difference is not larger than the predetermined value, the overload compensation control circuit 14 outputs a control signal to the input amplitude control portion 13.

According to this embodiment, the digital amplifier can be protected without suspending operation as in the aforementioned embodiments. The embodiment is preferably applied to a digital amplifier for business purposes to be used in a use method expected not to suspend operation.

Figure 6:
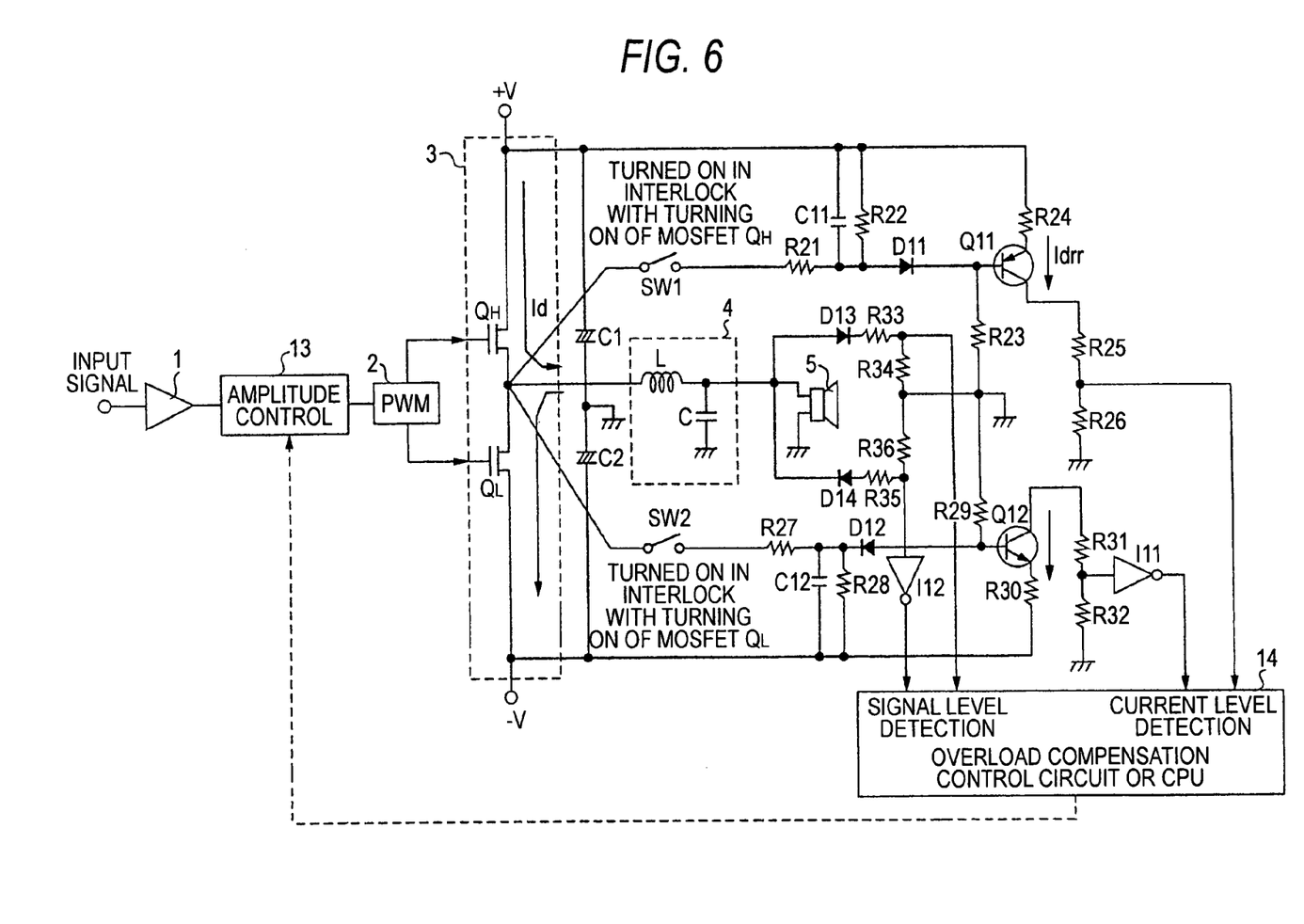
FIG. 6 is a block diagram showing the configuration of further another embodiment of a digital amplifier according to the invention.

FIG. 6 is a block diagram showing further another embodiment of a digital amplifier according to the invention. In the embodiment shown in FIG. 6, on-resistances of MOSFETs QH and QL are used in the same manner as in the aforementioned embodiment shown in FIG. 4, in place of provision of the current detection resistors Rd1 and Rd2 in the aforementioned embodiment shown in FIG. 5. Operation in the embodiment is similar to that of FIG. 5. Therefore, description thereof will be omitted here.

In the embodiments shown in FIGS. 5 and 6, a current detection portion and an output voltage detection portion are provided for each of the high side and the low side. However, the current detection portion and the output voltage detection may be provided on only one of the high side and the low side.

A protection circuit 12 as shown in FIGS. 3 and 4 may be provided in place of the overload compensation control circuit 14 in order to perform protection operation such as disconnection of the switch 9 or power off.

Although the aforementioned embodiments have been described on the case where an MOSFET (N type or P type) is used as each switching device of the class D amplifier state, a PNP type or NPN type transistor may be used instead.

Although both positive and negative power supplies are used in each of the aforementioned embodiments, the invention is not limited thereto. Only one of the positive and negative power supplies may be used instead.

What is claimed is:

1. A digital amplifier comprising:
   a class D amplifier stage that includes a first switching device and a second switching device connected in series with each other;
   a low pass filter connected to an output of the class D amplifier stage;
   a current detection unit that detects a pulse current flowing into at least one of the first switching device and the second switching device;
   an output voltage detection unit that detects a voltage of an analog signal outputted from the low pass filter; and
   a protection unit that performs protection operation on the basis of the current value detected by the current detection unit and the output voltage detected by the output voltage detection unit, the protection unit starting protection operation in response to a low current value when the output voltage is low, the protection unit starting protection operation in response to a high current value when the output voltage is high.

2. A digital amplifier according to claim 1, wherein the current detection unit detects a voltage generated between opposite ends of a resistor inserted in series with the first or second switching device.

3. A digital amplifier according to claim 1, wherein the current detection unit detects a voltage generated between opposite ends of the first or second switching device when the switching device is on.

4. A digital amplifier according to claim 1, wherein the protection unit includes:
   a switching element that is activated when the current value detected by the current detection unit exceeds a predetermined threshold value; and
   a threshold value adjustment circuit that changes the threshold value in accordance with the output voltage detected by the output voltage detection unit.

5. A digital amplifier according to claim 1, wherein the current value detected by the current detection unit and the output voltage detected by the output voltage detection unit are inputted in the protection unit, and the protection unit performs protection operation when the current value exceeds a threshold value corresponding to the output voltage.

6. A digital amplifier according to claim 1, further comprising a switching element for disconnecting the output low pass filter and a load from each other in accordance with an output of the protection unit.

7. A digital amplifier according to claims 1, further comprising a unit for controlling amplitude of an input signal in accordance with an output of the protection unit.

* * * * *